United States Patent [19]

Tuan

[11] 4,262,342
[45] Apr. 14, 1981

[54] CHARGE RESTORE CIRCUIT FOR SEMICONDUCTOR MEMORIES

[75] Inventor: Hsing T. Tuan, Poway, Calif.

[73] Assignee: Burroughs Corporation, Detroit, Mich.

[21] Appl. No.: 53,084

[22] Filed: Jun. 28, 1979

[51] Int. Cl.³ .............................................. G11C 7/00
[52] U.S. Cl. ................................... 365/203; 365/205; 365/222
[58] Field of Search ....................... 365/205, 203, 222

[56] References Cited

U.S. PATENT DOCUMENTS

| | | | |
|---|---|---|---|
| 3,806,898 | 4/1974 | Askin | 365/222 |
| 4,028,557 | 6/1977 | Wilson | 365/205 |
| 4,061,999 | 12/1977 | Proebsting et al. | 365/203 |
| 4,130,897 | 12/1978 | Horne et al. | 365/205 |
| 4,162,416 | 7/1979 | Beecham et al. | 365/222 |

*Primary Examiner*—Stuart N. Hecker
*Attorney, Agent, or Firm*—Charles J. Fassbender; Kevin R. Peterson

[57] ABSTRACT

Disclosed is a circuit for restoring charge to the cells of a semiconductor memory during a read operation. A respective one of the circuits couples to each of the bit lines of the memory. No power is dissipated in those circuits which couple the bit lines that are to be discharged during a read. Also, the circuit includes only three transistors, and thus occupies a minimal amount of chip space. In addition, the circuit is operable in response to only a single clocking signal. Further, the circuit is operable over a relatively large range of precharge voltage levels for the bit lines such as 3 volts to 7 volts.

13 Claims, 6 Drawing Figures

CHARGE RESTORE CIRCUIT FOR SEMICONDUCTOR MEMORIES

BACKGROUND OF THE INVENTION

This invention relates to semiconductor memories; and more particularly to that portion of the memory which operate to restore charge into the memory cells during a read operation. The most common architecture for semiconductor memories of the type with which we are concerned with here includes an array of memory cells, and a plurality of sense amplifiers selectively coupled to those cells via bit lines. The amplifiers sense charge in the cells during the read operation.

Each sense amplifier includes a pair of cross-coupled transistors having gates coupled to respective bit lines. Initially, the bit lines are precharged to a predetermined voltage level. Subsequently, one of the memory cells is selectively gated onto one of the bit lines, and a dummy cell (which has substantially less storage capacity than the memory cells) is gated onto the other bit line. As a result, the precharge voltage levels are modified slightly to indicate the data that was stored in the selected memory cell.

Next the source of the two cross-coupled transistors in the sense amplifier are connected to ground. In response thereto, the modified voltage levels of the bit lines begin to discharge towards ground at respective rates which indicate the data that was stored in the selected memory cell. That data is represented as either a relatively high voltage level or a relatively low voltage level. In the case where the selected cell contained a relatively high voltage level, that level is lowered somewhat; and it must be fully restored into the memory cell. That function is performed by the presently disclosed charge restore circuits.

Several other charge restore circuits also exist in the prior art. However, those circuits all exhibit various undersirable characteristics. For example, it is important that the charge restore circuit contains as few components as possible. This is because in a semiconductor memory, chip space is at a premium. Thus a recharge circuit is of no practical value unless it can be efficiently laid out in accordance with the array of memory cells.

Further, it is important that the charge restore circuit be operable over a wide range of precharge voltage levels for the bit lines. This provides an operating margin for the memory. That is, it enables the memory to function properly even though the supply voltages are not held within a tight tolerance.

In addition, it is desirable that the charge restore circuits dissipate as little power as possible. This is because power dissipation produces heating; and that in turn requires a means be provided for dissipating the heat from the memory chip. Otherwise, the operating temperature limits of the memory chip will be exceeded.

None of the prior art charge restore circuits for semiconductor memories offer all of the above features. Further discussion of this point is included herein in conjunction with the description of FIGS. 5 and 6. Therefore, it is a primary object of the invention to provide an improved charge restore circuit for semiconductor memories wherein all of the above features are achieved.

BRIEF SUMMARY OF THE INVENTION

These and other objects are accomplished in accordance with the invention by a charge restore circuit which includes a first transistor having a source coupled to one of the bit lines of the memory, and a gate coupled to receive a supply voltage $V_{DD}$. The circuit also includes a capacitor having one input terminal coupled to the drain of the first transistor, and having another input terminal coupled to receive a clock signal $\phi_R$. A second transistor is included in the circuit having a source coupled to the one bit line, having a gate coupled to the drain of the first transistors, and having a drain coupled to receive the supply voltage $V_{DD}$. One such circuit respectively couples to each of the bit lines in the memory.

BRIEF DESCRIPTION OF THE DRAWINGS

Various features and advantages of the invention will best be understood by reference to the Detailed Description and accompanying drawings wherein.

DETAILED DESCRIPTION

Figure 1:
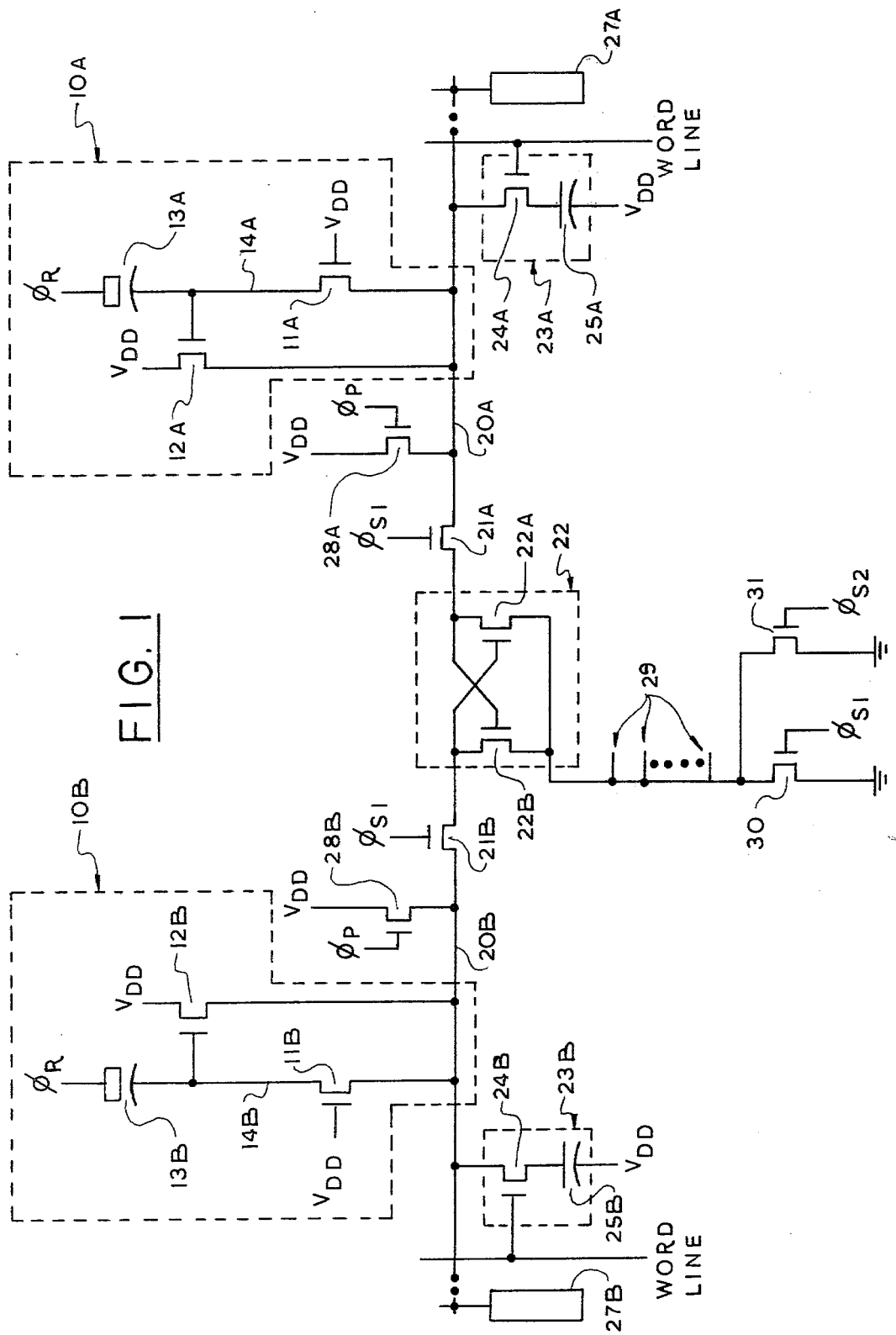
FIG. 1 is a circuit diagram illustrating the disclosed recharge circuit and its interconnections within a memory.

Referring now to FIG. 1, a detailed circuit diagram of one preferred embodiment of the invention will be described. In that figure, the disclosed charge restore circuit is indicated via reference numerals 10a and 10b. The remaining portion of FIG. 1 illustrates known prior art; but it is included herein in order that the useful functions which circuits 10a and 10b perform may be fully understood.

Circuits 10a and 10b are identical to each other. They simply connect to different bit lines 20a and 20b. Circuit 10a includes a pair of MOS transistors 11a and 12a, and a capacitor 13a. Similar components are included in circuit 10b as indicated via reference numerals 11b, 12b, and 13b.

Transistor 11a has a source coupled to bit line 20a, a gate coupled to receive a supply voltage $V_{DD}$, and a drain coupled to both the gate of transistor 12a and a node 14a of capacitor 13a. Capacitor 13a has another input terminal which is coupled to receive a recharge clocking signal $\phi_R$. Transistor 12a has a source which also couples to bit line 20a, and a drain which is coupled to receive voltage $V_{DD}$.

All of the components of circuit 10b are interconnected in a similar manner to bit line 20b. In turn, bit lines 20a and 20b are respectively coupled through transistors 21a and 21b to a sense amplifier 22. The sense amplifier consists of a pair of cross-coupled transistors 22a and 22b.

A plurality of memory cells couple to bit lines 20a and 20b. Only two of these memory cells 23a and 23b are indicated in FIG. 1 as an example. Each of the memory cells includes a gating transistor 24 and a charge storage capacitor 25. These capacitors are selectively gated onto the bit lines by application of an appropriate voltage to word lines 26a and 26b.

A pair of dummy cells 27a and 27b also respectively couple to bit lines 20a and 20b. These cells have the same general structure as cells 23a and 23b; however, they have substantially less charge storage capacity. Further coupled to the bit lines 20a and 20b, are a pair of transistors 28a and 28b. These transistors provide a means for precharging the bit lines 20a and 20b to $V_{DD}$.

All of the above described circuitry is repeated multiple times in an actual memory chip. This is indicated via reference numeral 29. A pair of transistors 30 and 31 are then provided to couple the sources of transistors 28a and 28b in each of the amplifiers 22 to ground. These transistors are made conductive in response to clocking signals $\phi_{s1}$ and $\phi_{s2}$.

One important feature of circuits 10a and 10b is that they only include a total of three components. This is importnat because the circuits must not occupy too much chip space. For example, in a memory containing 64K memory cells, the cells might suitably be arranged as an array of 256 rows and 256 columns, with each of the rows being split into two bit lines as illustrated in FIG. 1. Accordingly, circuits 10a and 10b would both be repeated 256 times; and thus the space which those circuits occupy becomes critical.

Figure 2:
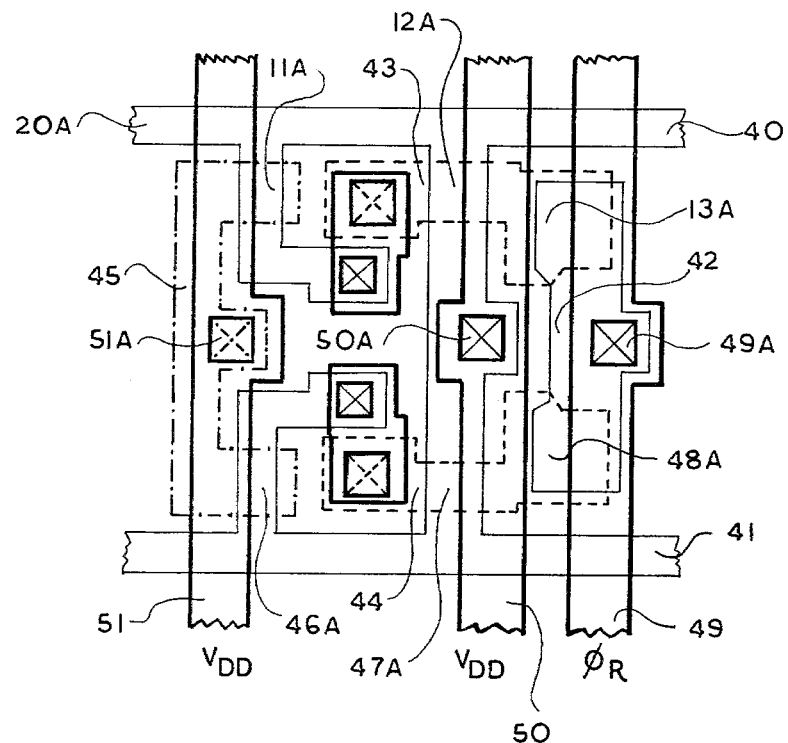
FIG. 2 is a greatly enlarged plane view illustrating a preferred physical layout for the recharge circuit of FIG. 1.

A preferred layout for the restore circuits is illustrated in FIG. 2. There the bit lines of the memory are spaced apart in pairs lying parallel to one another. Reference numerals 40 and 41 indicate one such pair of bit lines. Bit line 40 could correspond to bit line 20a for example; and bit line 41 would then correspond to the bit line which interconnects the next row of cells.

Bit lines 40 and 41 are formed by diffusions in the substrate of a semiconductor chip. These may be either N+ or P+ type diffusions. If they are N+, then all of the transistors in FIG. 1 are N channel and the supply voltage $V_{DD}$ and clocking signals $\phi_p$, $\phi_{s1}$, $\phi_{s2}$, $\phi_R$ are positive; whereas when the diffusions are P+, all of the transistors in FIG. 1 are P channel and the supply voltages and clocking signals are negative.

Another diffusion region 42 lies between bit lines 40 and 41 as illustrated. Region 42 is formed of the same type impurity atoms as regions 40 and 41. An insulating layer, such as silicon dioxide, overlies regions 40, 41, and 42; and lying on that insulating layer are three patterned polysilicon regions 43, 44, and 45.

The gate of transistor 11a is formed by the overlap between diffusion 40 and polysilicon region 45. Similarly, the gate of transistor 12a is formed by the overlap of diffusion 40 and polysilicon region 43; and capacitor 13a is formed by the overlap between diffusion 42 and polysilicon region 43. Reference numerals 46a, 47a, and 48a respectively indicate those components which are similar to components 11a, 12a, and 13a but which connect to bit line 41.

An insulating layer overlies polysilicon regions 43, 44, and 45; and lying on that insulating layer are patterned conductors 49, 50, and 51. Suitably, those conductors are made of metal, such as aluminun. Conductor 49 connects through an aperture 39a to diffusion 42. Similarly, conductor 50 connects through an aperture 50a to diffusions 40 and 41; and conductor 51 connects through an aperture 51a to polysilicon region 45. These interconnections enable supply voltage $V_{DD}$ and clocking signal $\phi_R$ to be appropriately applied to various nodes in the recharge circuit.

In one preferred embodiment of the FIG. 2 layout, the insulating layer which lies beneath polysilicon region 45 is substantially thicker than the insulating layer which lies beneath polysilicon regions 43 and 44. Consequently, the threshold voltage of transistor 11a is greater than the threshold voltage of transistor 12a. For example, the thicker insulating layer may be 900 Å; while the thinner insulating layer is only 400 Å. With $V_{DD}$ equal to 5 volts and $V_{BB}$ equal to $-2.2$ volts, these insulating layer thicknesses set the threshold voltage of transistors 11a and 12a respectively at 1.2 volts and 0.7 volts.

The functional significance of these different thresholds will be described shortly in conjunction with FIG. 4. First however, it should be pointed out that the two oxide thicknesses may also be usefully incorporated into the construction of all of the memory cells 23a and 23b. Thus no special masking steps are required solely to fabricate the charge restore circuits.

Figure 3:
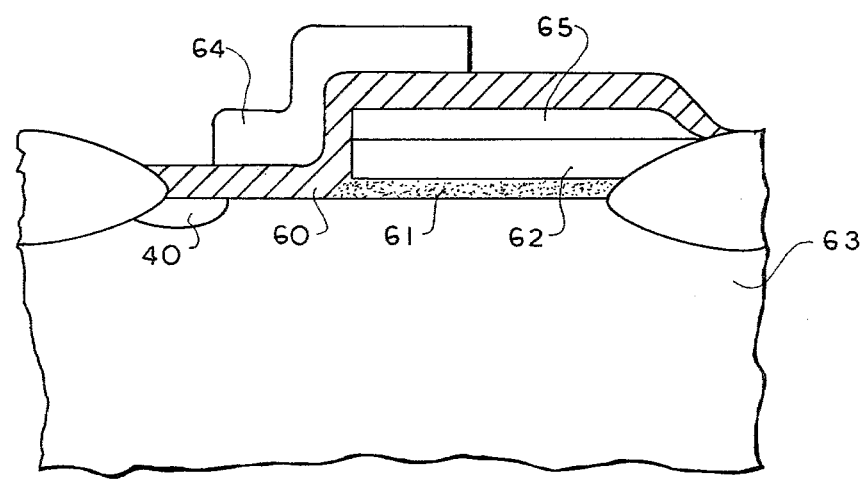
FIG. 3 is a cross-sectional view illustrating a memory cell having a physical layout which is compatible with the charge restore circuit of FIG. 2.

FIG. 3 is a cross-sectional view of one of the memory cells that illustrates the above point. There, the thicker insulating layer is indicated via reference numeral 60, whereas the thinner insulating layer is indicated via reference numeral 61. Layer 61 separates a conductive plate 62 from a substrate 63; and components 62 and 63 form the charge storage capacitor of the memory cell. The storage capacity of that capacitor is inversely proportional to the thickness of layer 61. Thus it is desirable that layer 61 be relatively thin.

On the other hand, insulating layer 60 separates conductor 62 from another conductor 64, the latter of which forms a transistor that gates the charge in the capacitor onto the bit line. It is desirable to separate conductors 62 and 64 from each other with a relatively thick insulating layer in order to prevent shorts between them. Additional protection from shorts to the top surface of conductor 62, but not the end of that conductor, may be provided by including still another insulating layer 65 in the cell.

Figure 4:
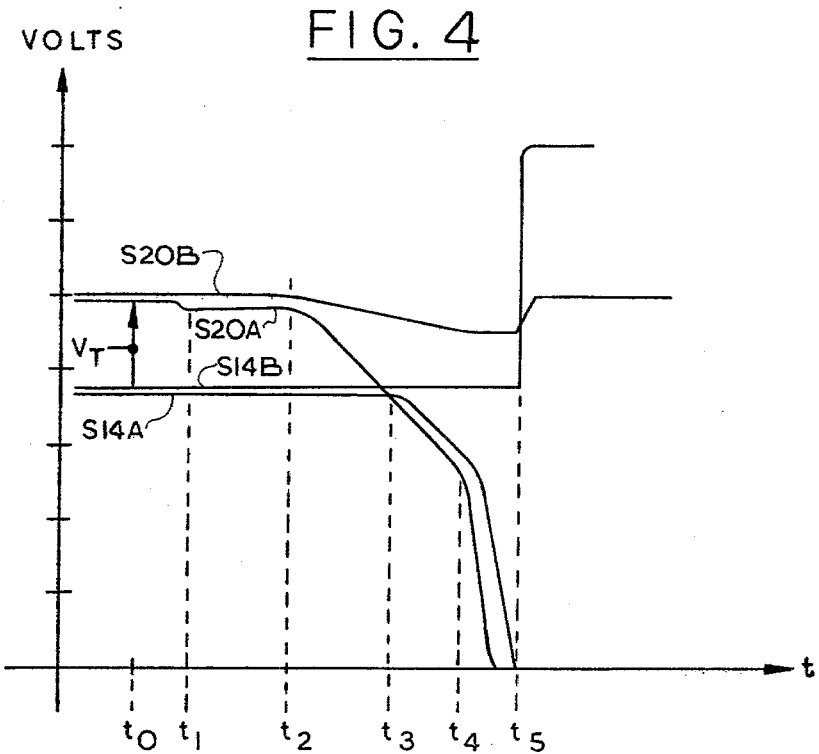
FIG. 4 is a set of curves illustrating the operation of the charge restore circuit of FIG. 2.

Referring now to FIG. 4, the functional operation of recharge circuits 10a and 10b will be described. Basically, that figure includes a set of curves illustrating voltage signals at various key nodes in the FIG. 1 circuit during a read operation. In particular, curve S20a illustrates the signal on node 20a; curve S20b illustrates the signal on node 20b; curve S14a illustrates the signal on node 14a; and curve S14b illustrates the signal on node 14b.

Prior to time instant t0, nodes 20a and 20b are precharged to voltage level $V_{DD}$. This precharging occurs through transistors 28a and 28b by application of clocking signal $\phi_p$ thereto. $V_{DD}$ is illustrated in FIG. 4 as being equal to 5 volts. At the same time, nodes 14a and 14b are also precharged through transistors 11a and 11b respectively. Those transistors conduct until the voltage level at nodes 14a and 14b reaches one threshold level below $V_{DD}$. This is indicated in FIG. 4 by the symbol $V_T$.

Subsequently at time instant t1, one of the memory cells is selectively gated onto bit line 20b while the dummy cell 27a is gated onto bit line 20a. For the present, it is assumed that the memory cell which is gated onto bit line 20b has a high voltage level stored therein, and thus the voltage level of bit line 20b stays at 5 volts. In comparison, the dummy cell 27a always has zero volts stored in it; and this in turn causes the voltage level of bit line 20a to drop to an intermediate level of approximately 4.8 volts.

Note that if a 0 voltage level were stored in the memory cell that was gated onto bit line 20b, the voltage level of that bit line would drop even further to approximately 4.6 volts. The reason for this is that the charge storage capacity of the memory cells are substantially greater than the charge storage capacity of the dummy cells. All of the waveforms that would then follow are the same as those illustrated in FIG. 4 except that the labeling of signals S20a and S20b are interchanged, and the labeling of signals S14a and S14b are also interchanged.

Next, at time instant t2, clocking signal $\phi_{s1}$ is applied to turn on transistors 21a, 21b, and 30. In response, transistors 22a and 22b both conduct. However, transistor 22a conducts slightly more than transistor 22b since the voltage level of bit line 20b is slightly higher than the voltage level of bit line 20a. As a result, bit line 20a discharges at a faster rate than bit line 20b.

Eventually, at time instant t3, the voltage of bit line 20a drops to the precharged voltage level of node 14a. This is one threshold voltage level below $V_{DD}$; and as a result, transistor 11a turns on. Thus, node 14a discharges along with bit line 20a. Subsequently, transistor 31 is turned on in parallel with transistor 30 due to the simultaneous application of clocking signals $\phi_{s1}$ and $\phi_{s2}$. As a result, the conductivity of transistor 22a is increased. And this in turn fully discharges bit line 20a and node 14a, and also turns off transistor 22b.

Then at time instant t5, clocking signal $\phi_R$ is applied to capacitors 13a and 13b. Since transistor 11b is turned off, node 14b is bootstrapped to a high voltage level which is well above $V_{DD}$. Consequently, transistor 12b turns on and recharges both bit line 20b and the storage capacitor of the memory cell which was selectively gated thereto to the $V_{DD}$ voltage level. In comparison, transistor 11a is fully turned on, since its gate is at $V_{DD}$ and its source is at ground. Thus, with the application of clocking signal $\phi_R$ to capacitor 13a, the voltage level of node 14a remains clamped to ground; and transistor 12a remains off.

Since transistor 12a never turns on, no power is dissipated in circuit 10a. This is an important feature of that circuit. In comparison, some of the prior art charge restore circuits operate to temporarily gate the precharge voltage to the bit line, even though that bit line is attempting to discharge to ground. As a result, those circuits dissipated an undesirably high amount of power. This point will be further developed in conjunction with FIG. 5.

Another important feature of the disclosed charge restore circuit is that it operates over a relatively wide range of precharge voltage levels for the bit lines. For example, they operate over a precharge voltage range of 7 volts to 3 volts. In essence, this is due to the fact that the precharge voltage level of nodes 14a and 14b track the precharge voltage level of the bit lines. That is, nodes 14a and 14b charge to one threshold level below the bit lines, as opposed to charging to some fixed level.

Thus, if nodes 20a and 20b are precharged to 7 volts, nodes 14a and 14b will precharge through transistors 11a and 11b to approximately 7 volts minus 1.2 volts. (More precisely, nodes 14a and 14b will precharge to 7 volts minus 1.4 volts, since the threshold voltage of transistors 11a and 11b increases as their source voltage increases.) The operation of the circuit will then be the same as illustrated in FIG. 4 except that signals S20a, S20b, S14a, and S14b will all be shifted up on the vertical axis by 2 volts.

Similarly, if nodes 20a and 20b are precharged to only 3 volts, then nodes 14a and 14b will only be precharged to approximately 3 volts minus 1.2 volts. (Again more precisely, the precharge voltage level will be slightly less since the threshold voltage level of transistors 14a and 14b decreases as their source voltage decreases.) The operation of the circuit will then be the same as illustrated in FIG. 4 except that signals S20a, S20b, S14a, and S14b will move down the vertical axis by 2 volts. This is to be compared with the prior art charge restore circuit of FIG. 6 which simply will not operate over a 3 volt to 8 volt range.

As mentioned earlier, in one preferred embodiment, the gate insulating layer of transistors 11a and 11b are substantially thicker than the gate insulating layer of transistors 12a and 12b. The operational significance of this may be understood by reference to FIG. 4. Basically, since transistors 11a and 11b have a relatively thick gate insulating layer, they also have a relatively high threshold voltage $V_T$. Thus in FIG. 4, signals S20a and S20b are separated from signals S14a and S14b by a relatively large increment. This is desired since it allows the bit line which is to be recharged to discharge substantially during a reading cycle without adversely affecting the operation of the recharge circuits.

For example in FIG. 4, signal S20b is illustrated as discharging between time instants t2 and t4. However, since signal S20b never falls below signal S14b, transistor 11b never turns on. Thus, signal S14b remains at its precharged level. This in turn allows clocking signal $\phi_R$ to fully bootstrap node 14b and fully turn on transistor 12b at time instant t5.

Conversely, due to their thin gate insulating layer, transistors 12a and 12b have relatively low threshold voltages. This however is desirable because it allows those transistors to turn on fully in response to the bootstrap clocking signal $\phi_R$. As a result, the bit line recharges rapidly. This is indicated by signals S20b and S14b in FIG. 4 after time instant t5. A rapid recharge of the bit line is, of course, desired since it shortens the effective read cycle for the memory cells.

Figure 5:
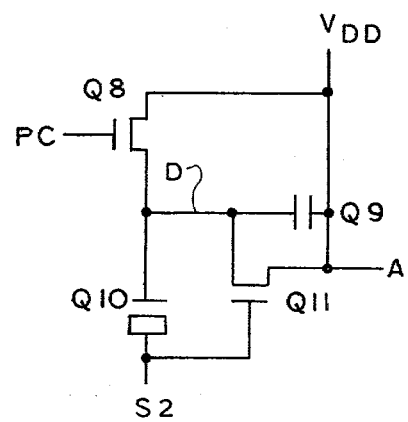
FIG. 5 is a circuit diagram of one prior art charge restore circuit for comparison purposes.

All of the above described operation features of circuits 10a and 10b may be more fully appreciated when they are compared against the best known prior art. For example, FIG. 5 illustrates a charge restore circuit that is disclosed in U.S. Pat. No. 4,028,557 issued June 7, 1977. That circuit includes a total of four transistors which are labeled Q8, Q9, Q10, and Q11. This is in comparison to the presently disclosed circuits which only require a total of three transistors. Further, the operation of the FIG. 5 circuits requires the application of two independent clocking signals S2 and PC. This is in comparison to the presently disclosed which require only one clocking signal $\phi_R$.

In addition, the FIG. 5 circuit dissipates power regardless of whether or not it is connected to a bit line that is to be recharged to the precharge voltage level. Node A of that circuit connects to the bit line. In operation, signal PC first turns on transistor Q8 and precharges node D to the voltage level $V_{DD}$. At the same time, node A is precharged through transistor Q9 to a voltage that is one threshold level below $V_{DD}$. Subsequently, the sense amplifiers (which are not shown but which are connected to node A) are enabled; and node A thus begins to discharge.

However, as node A discharges, Q9 begins to conduct since the gate to source voltage of Q9 is greater than one threshold level. The conduction of Q9 is undesirable when node A is attempting to fully discharge. In that case, power is wastefully dissipated in transistor Q9. Subsequently, signal S2 goes high which in turn makes transistor Q11 conductive and eventually discharges node D. This in turn stops transistor Q9 from conducting further. However, before that occurs, the occurrence of signal S2 causes node D to be bootstrapped through transistor Q10; and this increases the power dissipation in transistor Q9 until node D has had time to discharge. No such power dissipation occurs in the disclosed recharge circuits 10a and 10b.

Figure 6:
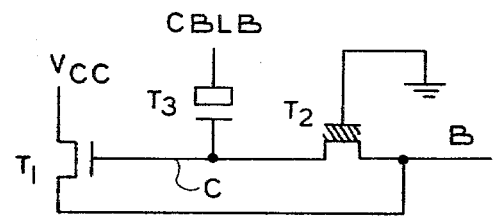
FIG. 6 is a circuit diagram of another prior art charge restore circuit for comparison purposes.

Another prior art circuit is illustrated in FIG. 6; however, that circuit will not operate over a precharge voltage range for the bit lines of 3 to 7 volts. That circuit is disclosed at page 143 in the Digest of Technical Papers for the February 1979 IEEE International Solid State Conference. The circuit consists of three transistors T1, T2, and T3. T2 is a depletion transistor which has a threshold voltage level of approximately minus −3.5 volts.

In the intended operation, the bit lines and node B (which is connected thereto) is precharged to 5 volts. Consequently, node C is precharged through transistor T2, but the voltage level to which node C is precharged is fixed at one threshold voltage level with respect to ground. In other words, node C precharges to the fixed voltage level of 3.5 volts, even when the bit lines are intentionally or inadvertently precharged to some voltage level above 5 volts such as 7 volts, for example.

The problem with this is that with node C at 3.5 volts and node B at 7 volts, transistor T1 will not turn on with the subsequent application of clocking signals CBLB to transistor T3. As a result, the bit line B will never be recharged through transistor T1 to the 7 volt precharged voltage level. In other words, the circuit will operate when the bit lines are precharged to voltage levels substantially above 5 volts.

Similarly, the circuit of FIG. 6 will not operate when the precharge voltage levels of the bit lines are substantially less than 5 volts. Consider for example the case where the bit lines are precharged to only 3 volts. In that case, node C is also precharged to 3 volts through transistor T2 as described above. Subsequently however, when the sense amplifiers are enabled, node B will begin to discharge. When that occurs, node C will also discharge through transistor T2. This occurs because the difference in voltage between the gate of transistor T2 and node B is greater than one threshold voltage level.

However, node C should not be allowed to discharge for those cases where node B is to be recharged to its initial precharge voltage level. And if node C is allowed to discharge, then the subsequent application of clocking signal CBLB to transistor T3 will not turn on transistor T1, and thus node B will not be recharged. In comparison, the disclosed circuits 10a and 10b have no such operation limitations.

Various preferred embodiments of the invention have now been described in detail. In addition, many changes and modifications can be made to these details without departing from the nature and spirit of the invention. Thus, it is to be understood that the invention is not limited to said details but as defined by the appended claims.

What is claimed is:

1. A random access memory on a semiconductor chip incorporating an improved circuit for restoring charge to the cells of said memory during a read operation, said memory including:
    an array of said cells for storing charge therein, and a plurality of sense amplifiers selectively coupled to said cells via bit lines for sensing charge in said cells during said read operation;
    wherein each of said bit lines also couples to a respective one of said improved circuits, and wherein each of said improved circuits is comprised of:
    a first transistor having a source coupled to one of said bit lines, and having a gate coupled to receive a supply voltage;
    a capacitor having one input terminal coupled to the drain of said first transistor, and having another input terminal coupled to receive a clock signal; and
    a second transistor having a source coupled to said one bit line, having a gate coupled to said drain of said first transistor; and having a drain coupled to said supply voltage.

2. A memory according to claim 1 wherein said first and second transistors are P-channel.

3. A memory according to claim 1 wherein said first and second transistors are N-channel.

4. A memory according to claim 1 wherein said capacitor is comprised of a third transistor having a source and a drain which are interconnected to form said one input terminal, and having a gate which forms said another input terminal.

5. A memory according to claim 1 wherein said first transistor has a higher threshold voltage level than said second transistor.

6. A memory according to claim 5 wherein said first transistor has a thicker gate insulating layer than said second transistor.

7. A memory according to claim 6 wherein each of said cells includes a charge transfer gate and a charge storage plate which lie over the substrate of said chip on respective insulating layers of the same thickness as said gate insulating layer of said first and second transistors.

8. A memory according to claim 1 wherein said bit lines are spaced apart in pairs lying parallel to one another, and wherein two of said improved circuits lie within the space between each of said bit line pairs.

9. In a random access semiconductor memory chip comprised of a plurality of memory cells coupled via a pair of bit lines to a sense amplifier, a method of selectively reading and restoring charge in said cells including the steps of:
    precharging both of said bit lines to a first voltage level, and simultaneously precharging a corresponding pair of capacitive nodes to said first voltage level minus a predetermined increment relative thereto;
    modifying the precharge voltage of said bit lines by gating one of said memory cells onto one of said bit lines and by simultaneously gating a dummy cell of substantially less charge storage capacity than said memory cell onto the other bit line;
    partially discharging both of said bit lines through said sense amplifier at rates representative of the respective modified voltage levels of said bit lines;
    discharging only that capacitive node which corresponds to the one bit line which first discharges below the precharge voltage level of said capacitive nodes; and recharging only that bit line whose corresponding capacitive nodes has not been discharged.

10. A method according to claim 9 wherein said predetermined increment is one threshold voltage level of a MOS transistor.

11. A method according to claim 10 wherein said pair of capacitive nodes are precharged through respective MOS transistors having a gate coupled to receive said first voltage level, a source coupled to one of said bit lines, and a drain coupled to one of said capacitive nodes.

12. A method according to claim 11 wherein said MOS transistors are N-channel and the precharge level of said bit lines and said capacitive nodes are positive.

13. A method according to claim 11 wherein said MOS transistor is P-channel and the precharge level of said bit lines and said capacitive nodes are negative.

* * * * *